(12) United States Patent
Self et al.

(10) Patent No.: US 6,922,045 B2
(45) Date of Patent: Jul. 26, 2005

(54) CURRENT DRIVER AND METHOD OF PRECISELY CONTROLLING OUTPUT CURRENT

(75) Inventors: David W. Self, Tempe, AZ (US); C. Phillip McClay, Fountain Hills, AZ (US)

(73) Assignee: Primarion, Inc., Phoenix, AZ (US)

( * ) Notice: Subject to any disclaimer, the term of this patent is extended or adjusted under 35 U.S.C. 154(b) by 0 days.

(21) Appl. No.: 10/365,432

(22) Filed: Feb. 13, 2003

(65) Prior Publication Data

US 2003/0151396 A1 Aug. 14, 2003

Related U.S. Application Data

(60) Provisional application No. 60/407,496, filed on Aug. 30, 2002, provisional application No. 60/407,495, filed on Aug. 30, 2002, provisional application No. 60/407,494, filed on Aug. 30, 2002, provisional application No. 60/407,493, filed on Aug. 30, 2002, and provisional application No. 60/356,806, filed on Feb. 13, 2002.

(51) Int. Cl.[7] .............................. G05F 3/16; G05F 3/20
(52) U.S. Cl. ........................ 323/313; 323/907; 323/314
(58) Field of Search ............................... 323/907, 313, 323/314, 315

(56) References Cited

U.S. PATENT DOCUMENTS 6,181,191 B1 * 1/2001 Paschal ....................... 327/513

* cited by examiner

*Primary Examiner*—Bao Q. Vu
(74) *Attorney, Agent, or Firm*—Theodore E. Galanthay (57) ABSTRACT

Disclosed is current driver circuit comprising a bandgap reference circuit for generating a fixed current and a current proportional to absolute temperature (PTAT), a temperature compensator for combining the fixed and PTAT currents and forming first and second temperature compensated currents, a current control circuit for modifying said first and second temperature compensated currents in response to signals representing the characteristics of a load device and a driver circuit for amplifying and supplying a selected one of said first and second temperature compensated currents to said load device. Also disclosed is a method of supplying a precisely controlled current by generating a constant current and a current proportional to absolute temperature (PTAT), combining these two currents and providing temperature compensated currents, modifying the temperature compensated currents with a programmed reference signal and supplying a precisely controlled current to a load device.

22 Claims, 5 Drawing Sheets

CURRENT DRIVER AND METHOD OF PRECISELY CONTROLLING OUTPUT CURRENT

CROSS REFERENCE TO RELATED APPLICATIONS

This patent application claims priority to, and the benefit of, U.S. provisional patent applications identified as follows:
1. Provisional Application Ser. No. 60/356,806 entitled, Current Source Output Light Emitting Device Driver, filed Feb. 13, 2002.
2. Provisional Application Ser. No. 60/407,496, entitled SYSTEM AND CIRCUIT FOR A MULTI-CHANNEL OPTOELECTRONIC DEVICE DRIVER Filed Aug. 30, 2002.
3. Provisional Application Ser. No. 60/407,495 entitled SYSTEM AND CIRCUIT FOR AN OPTOELECTRONIC DEVICE DRIVER Filed Aug. 30, 2002;
4. Provisional Application Ser. No. 60/407,493, entitled SYSTEM FOR TRANSMITTING OPTOELECTRONIC INFORMATION Filed Aug. 30, 2002.
5. Provisional Application Ser. No. 60/407,494, entitled TRANSIMPEDANCE AMPLIFIER AND CIRCUIT INCLUDING THE SAME Filed Aug. 30, 2002.

FIELD OF THE INVENTION

The present invention generally relates to current driver circuits providing precisely controlled low level current outputs with temperature compensation and a method of precisely controlling output current. More particularly, the invention relates to a true current source output for lasers requiring precisely controlled low levels of current, such as vertical cavity surface emitting lasers (VCSELs).

BACKGROUND OF THE INVENTION

As the rate of data transfer between microelectronic devices increases, use of typical electrical bus schemes to transmit information becomes increasingly problematic. In particular, as the amount of information transfer increases, an amount of input/output power required to transmit information between devices and consequently an amount of electronic noise associated with the transmission increase.

Another problem associated with transmission of electrical signals using traditional electrical bus systems is that signal attenuation and distortion increases as the rate of the transmitted signal increases. For example, when signals are transmitted at a rate of about 5 GHz using FR-4 substrate material, the signal suffers about a 5 dB loss across 10 cm. This loss can cause rise time degradation and amplitude loss for the signals as the higher order harmonics are filtered out. For high data rate transmission across greater lengths, potentially up to several kilometers, optical transmission is required. Accordingly, improved apparatus and systems for transmitting information between a plurality of microelectronic devices optically are desired. For the above reasons, although the majority of signal processing is done in the electrical domain, it has become highly advantageous to utilize optical communications to interconnect microelectronic devices.

In order to obtain the benefits of optical communications, electrical signals must be converted to optical signals and vice versa. Various high powered lasers have been developed in the telecommunication art for transmitting optical signals through optical fibers over long distances, such as many miles. Short to medium distance optical communications, such as within one box, or through optical cables that are not more than a few hundred meters in length, require various other light emitting devices. For such applications, a variety of lasers including Fabry-Perot and vertical cavity surface emitting lasers (VCSELs) have been developed. However, specialized circuits are needed to advantageously utilize this technology. In particular, such lasers require specialized electronic current drive circuits in order to modulate light output. There is a need in the art for improvements in such specialized circuits. What is desired is a precisely controlled true current source to achieve relative insensitivity to the characteristics of the various light emitting devices. There is also a need for such improved circuits to provide temperature compensation and efficient over voltage protection.

SUMMARY OF THE INVENTION

The present invention provides improved systems, circuits and techniques for driving light emitting devices such as lasers including Fabry-Perot and vertical cavity surface emitting lasers (VCSELs). An electronic circuit topology is described that forms a true current mode output laser diode driver. Although, the exemplary embodiments of this invention will be primarily described in terms of VCSEL driver applications, the invention is applicable to all light emitting devices with similar characteristics requiring a precisely controlled current drive. The VCSEL Driver's principal function is to interface a VCSEL diode to an electronic system for applications such as data communications or other optical signal processing. The VCSEL Driver of this invention includes a differential buffer amplifier, an output current driver, current control, temperature compensation, bandgap bias, and a fault detection circuit.

VCSEL diodes require current drive to modulate light output. The VCSEL driver described herein sources a programmable output current to the laser diode. The output current limits are programmed with control words (IMIN) for the minimum current and (IMAX) for the maximum current. Since the driver is a true current source, there is relative insensitivity to the load diode's characteristics. This allows for the use of various manufacturers' VCSELs without costly optical feedback mechanisms.

The current output operation of the VCSEL Driver also allows for open loop temperature compensation of the output current. This is accomplished by using an on-chip Bandgap current reference circuit. This circuit provides both a constant current reference and a linear PTAT (proportional to absolute temperature) current reference. These currents are combined and scaled in a temperature compensation circuit. The output of this circuit is programmable with a temperature control word (TEMPCOMP or TC). A temperature control word of two bits provides a temperature compensated reference current with four independently programmable current v. temperature slopes that are: 1. constant vs. temperature, 2. 1*PTAT current, 3. 2*PTAT current and 4. 3*PTAT current. This temperature compensated reference current determines the output current temperature slope, and can be optimized for the VCSEL diode's slope efficiency.

The current output operation of the VCSEL Driver also allows for a simple and efficient over voltage fault detection. With a known output modulation current, the output voltage varies significantly if the VCSEL diode or interconnects exhibit a high impedance condition. This output voltage can be sensed and compared to valid limits to determine a fault state.

In accordance with the disclosed embodiment of the invention, a constant current and a current proportional to absolute temperature (PTAT) are combined and then modified based on user provided digital input signals to supply precisely controlled temperature compensated current to a load device. The digital input signals are binary words programmed for the characteristics of the particular VCSEL or other load device.

The described embodiments can be implemented in bipolar junction transistor (BJT), heterojunction bipolar transistor (HBT), MOSFET, CMOS, or any other complementary transistor technology. The details of those processes are well known to those skilled in the semiconductor arts and are not described in detail herein.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. Also, in the detailed description of the exemplary embodiments, NPN bipolar transistors and P channel field effect transistors are shown, other technologies for implementing the invention are not specifically described.

DETAILED DESCRIPTION OF EXEMPLARY EMBODIMENTS

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. Further, it should be noted that while various components may be suitably coupled or connected to other components within exemplary circuits, such connections and couplings can be realized by direct connection between components, or by connection through other components and devices located therebetween. Also, for ease of explanation and understanding of the present invention, superfluous details have not been included.

Figure 1:
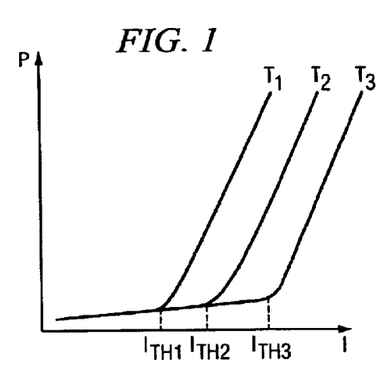
FIG. 1 is a waveform diagram illustrating the characteristics of one type of light emitting device.

Refer now to FIG. 1, which is a waveform diagram depicting Power Output v. Current Input in a typical telecommunications laser. The Power Output level is typically in the range of 1 m.watts to 10 m.watts, while the required current is up to 100 m.amps. As the temperature of the laser increases from T1 to T2 and then T3, the current required to drive the laser increases. Note that the threshold current ($I_{TH1}$, $I_{TH2}$, and $I_{TH3}$) increases with temperature. However, the Pv.I curves maintain the same slope along the T1, T2, and T3 lines. Supplying the correct current to a laser having such constant slope characteristics over varying temperatures is known and does not present the problems associated with driving a VCSEL.

Figure 2:
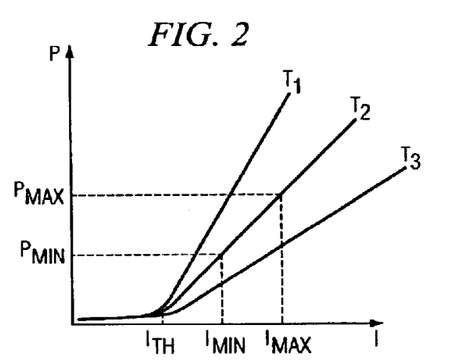
FIG. 2 is a waveform diagram illustrating the characteristics of VCSEL's and similar light emitting devices.
Figure 3:
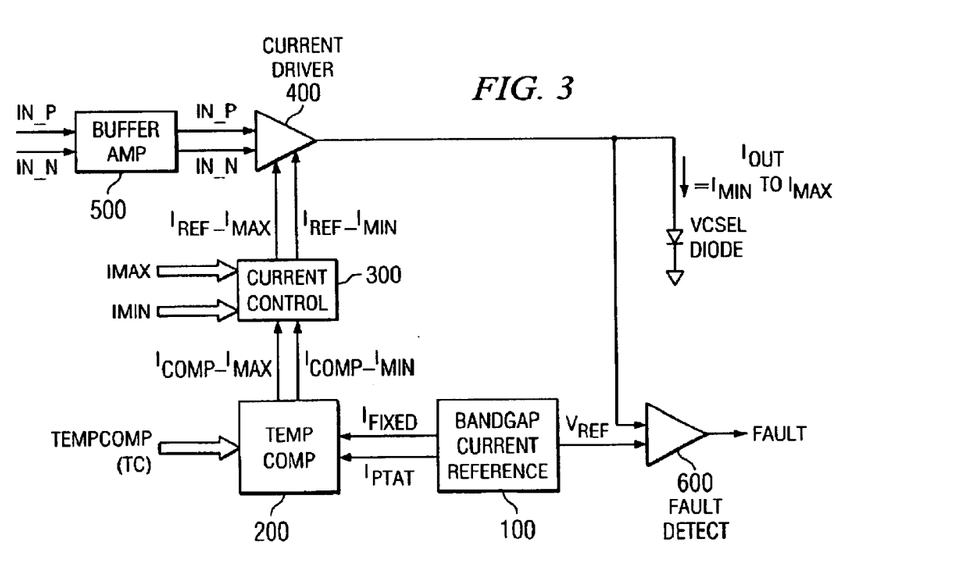
FIG. 3 is a block diagram illustrating the embodiment in accordance with the present invention.

Refer now to FIG. 2, which is a waveform diagram depicting Power Output v. Current Input in a typical VCSEL. The Power Output level is typically about 1 m.watt, while the required current is up to 10 m.amps. As the temperature of the VCSEL increases from T1 to T2 and then T3, the current required to drive the VCSEL increases. However, the current drive requirements are completely different for a VCSEL as compared with a telecommunications laser. For example, note that the threshold current $I_{TH}$ does not change noticeably with an increase in temperature. Rather, the slope of the curve changes with temperature. To properly drive such a VCSEL with current that will produce an output in the range of Pmax (i.e. laser in the ON condition, i.e. high logic state) to Pmin (i.e. laser in the low logic state), the maximum current and minimum current supplied to the VCSEL must be precisely controlled and temperature compensated for the varying slope characteristic of the VCSEL FIG. 3 illustrates the present invention in block diagram form, supplying current to one or more VCSEL's. In accordance with the embodiment of the invention, illustrated in FIG. 3, a system includes a differential buffer amplifier 500, differential complement outputs to single ended output current driver 400, current control 300, temperature compensator 200, Bandgap current reference 100, and a fault detection circuit 600. (Although the circuits of the present invention may be used to drive a variety of devices, the invention is conveniently described in connection with driving VCSELs).

Figure 4:
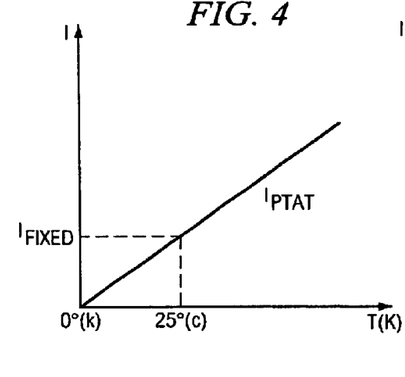
FIGS. 4 and 5 are waveform diagrams illustrating various aspects of the present invention.

Bandgap current reference circuit 100 generates a fixed current and a current proportional to absolute temperature (PTAT) and supplies these two currents to Temperature compensator 200. With continued reference to FIG. 3, see FIG. 4, which illustrates the PTAT current and fixed current. The PTAT current has a slope that increases linearly with temperature from 0 (at 0 degrees Kelvin). The fixed current remains constant at all temperatures. In practice, the fixed current is defined at 25 degrees C., which is a normal operating temperature where the values of the fixed current and PTAT current are equal. Circuit 100 includes temperature sensitive devices for generating the current proportional to absolute temperature. In practice, these temperature sensitive devices are placed in close proximity to the VCSEL diode so that the sensed temperature approximates the temperature of the VCSEL.

Figure 5:
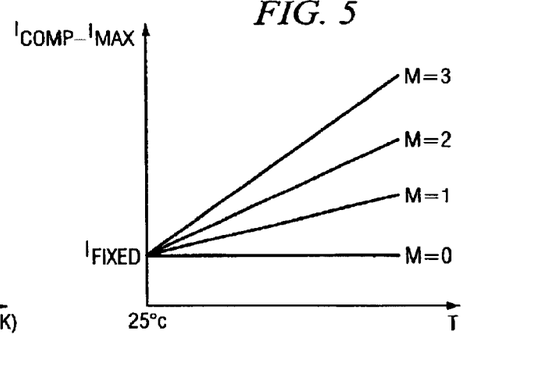

Temperature compensator 200 receives a digital input signal (TEMPCOMP) that is provided by the user, depending on the characteristics of the particular VCSELs being driven. These digital input signals are combined with the fixed current and the PTAT current to independently generate the compensated maximum current (Icomp_Imax) and minimum current (Icomp_Imin); which are supplied to the current control 300. Examples of the slope of the output current provided by Temperature compensator 200 are shown in FIG. 5.

Current control 300 receives digital signals (Imax and Imin) which are provided by the user, depending on the characteristics of the particular VCSELs being driven. These digital signals modify the compensated maximum and minimum currents and generate the maximum reference current (Iref_Imax) and the minimum reference current (Iref_Imin); which are provided to the current driver 400.

The maximum and minimum reference currents are supplied to current driver circuit 400. Current driver circuit also receives "up" and "down" level logic inputs from the high speed data path through Buffer amplifier 500. Buffer amplifier 500 receives the high speed data inputs IN_P and IN_N and after suitable buffering provides these digital signals to current driver 400. These digital signals then either gate an amplified maximum or an amplified minimum current to the VCSEL, depending on whether an "up" or "down" level logic input is received.

Figure 6:
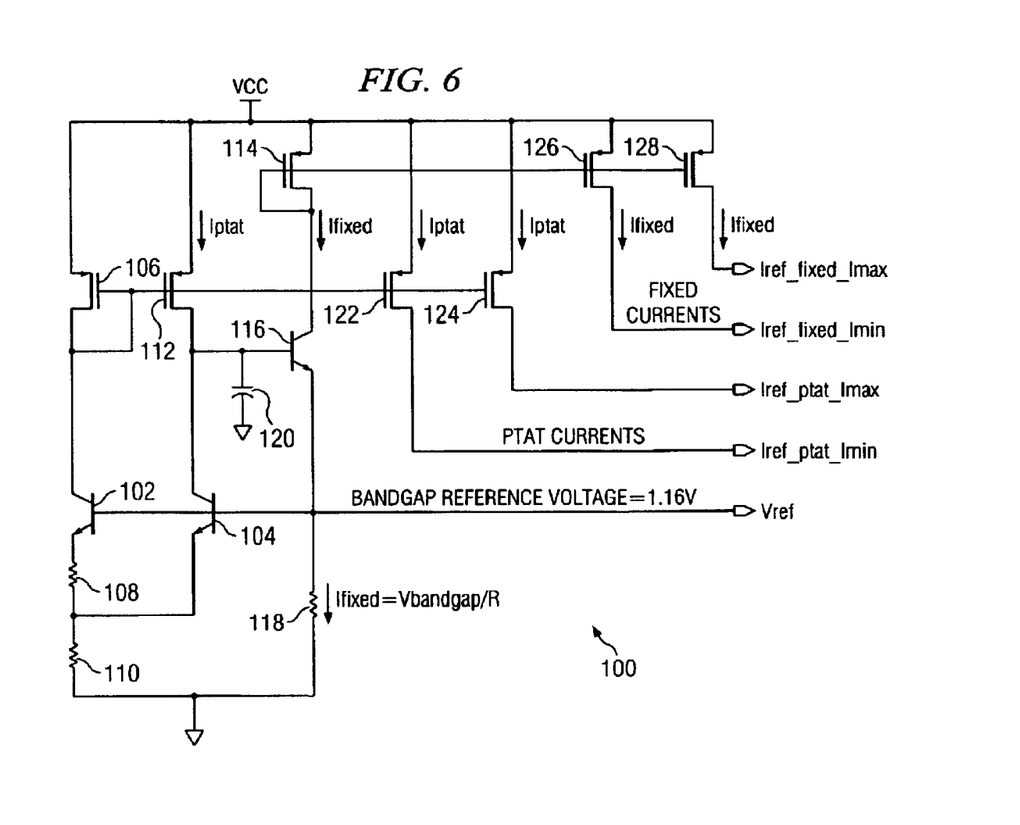
FIG. 6 is a circuit diagram illustrating the bandgap current reference generator of the present invention.

Refer now to FIG. 6 for a schematic circuit diagram of Bandgap current reference 100. The illustrated embodiment utilizes P channel FET devices and NPN bipolar transistors. Those skilled in the semiconductor and integrated circuit art will know how the illustrated circuit can be formed in other technologies, as well. Transistors 102 and 104 are ratioed temperature sensitive devices. In such temperature sensitive devices, the base to emitter voltage (Vbe) varies with temperature. It is known to design these devices with desired temperature response; which varies with the ratios of the two devices. Diode connected device 106, resistor 108 and resistor 110 are connected in series with transistor 102 between Vcc and ground and conduct a current that is proportional to absolute temperature (PTAT). Similarly, device 112 is connected in series with transistor 104 and with resistor 110 forms a series path between Vcc and ground. This current is also proportional to absolute temperature (PTAT). A fixed current flows from Vcc to ground in the series circuit formed by diode connected device 114, transistor 116 and resistor 118. The common node between transistor 116 and resistor 118 forms the bandgap reference voltage provided to the Fault detect block 600. This common node is also connected to the base of transistors 102 and 104. The collector of 104 is connected to the base of transistor 116 and capacitor 120. The feedback path formed by transistors 104 and 116 keeps the fixed current constant so that the bandgap reference voltage; which is established by the fixed current flowing through resistor 118 is maintained constant at 1.16 volts, for example, and supplied to Fault detect circuit 600.

Transistor 114 is connected in a current mirror configuration with transistors 126 and 128. These latter two devices provide the fixed reference currents to temperature compensator 200. As will become apparent, these currents are independently scaled in the subsequent circuitry. Transistor 106 is connected in a current mirror configuration with transistors 112, 122, and 124. Devices 122 and 124 provide the PTAT reference currents to temperature compensator 200. These reference currents are independently scaled in subsequent circuitry.

Figure 7:
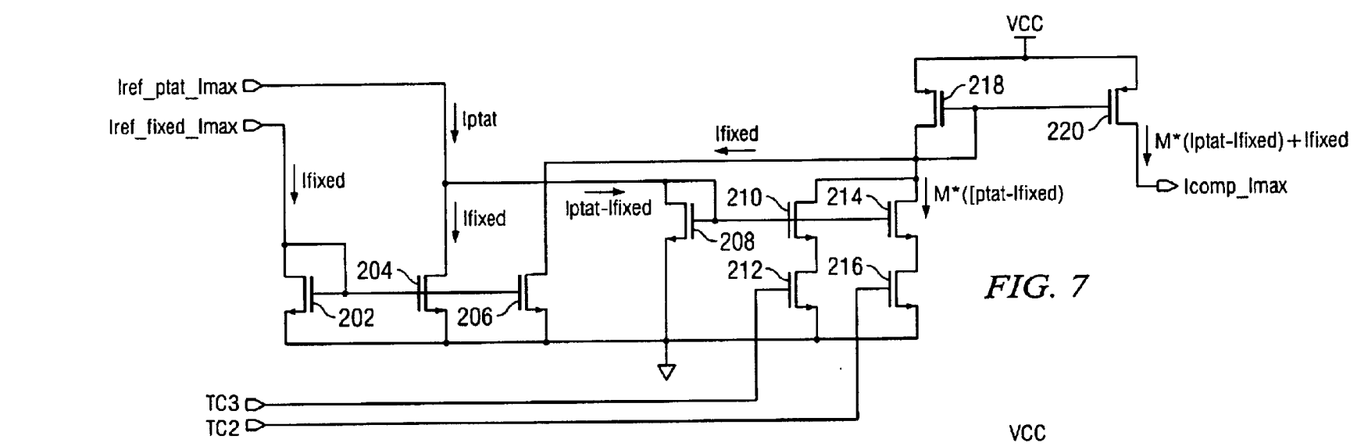
FIGS. 7 and 8 are circuit diagrams illustrating the temperature compensation circuit of the present invention.

Refer now to FIG. 7, which is an exemplary schematic circuit diagram for providing temperature compensated maximum current to current control 300. The fixed current is received into diode connected device 202, which is also connected to ground potential. Device 202 is connected in a current mirror configuration with devices 204 and 206, such that the fixed current also flows through each of devices 204 and 206. The maximum PTAT current is received at the common node connecting devices 204 and 208. Since the fixed current flows through device 204, the current flowing through device 208 must be the PTAT current minus the fixed current. Devices 210 and 214, connected as shown can conduct the same current as device 208 or a multiple thereof. In the illustrated example, the multiple can be 0, 1, 2, or 3 times, depending on the digital signal, (i.e. 2 bit binary word "M") received at terminals TC2 and TC3.

The digital signal is provided by the user and is based on the characteristics of the particular load device(s) (e.g. VCSELs). Devices 210 and 214 are scaled so that one conducts twice the current of the other. Devices 212 and 216 are utilized as series switches, allowing the currents in devices 210 or 214 to be switched ON or OFF. Thus, in the case where a binary 0 is received, both devices 212 and 216 remain off and no current flows. Rather, fixed current flows from Vcc through device 218 and then device 206 to ground. This fixed current is provided as an output to current control 300 by device 220. This is further illustrated in FIG. 5, showing that the fixed current is not modified when M=0. In the case where M=1, the input TC2 turns transistor 216 ON causing a current equal to the PTAT current minus the fixed current to flow. This latter current plus the fixed current then flow through transistors 218 and 220 providing a current slope as a function of temperature as illustrated at M=1 in FIG. 5. Note that the FIG. 5 chart defines 25 degrees C. and the fixed current as the starting point, presuming a temperature increase from there.

In the case where M=2, the input TC3 turns transistor 212 ON causing a current that is two times the difference between the PTAT current and the fixed current to flow through 212. Consistent with the previous explanation, this is represented by the current v. temperature slope M=2 in FIG. 5. Lastly when M=3, the inputs TC2 and TC3 turn both transistors 212 and 216 ON, causing a current that is three times the difference between the PTAT current and fixed current to be added to the fixed current at the output of 220. This results in the current slope as a function of temperature illustrated as M=3 in FIG. 5.

Figure 8:
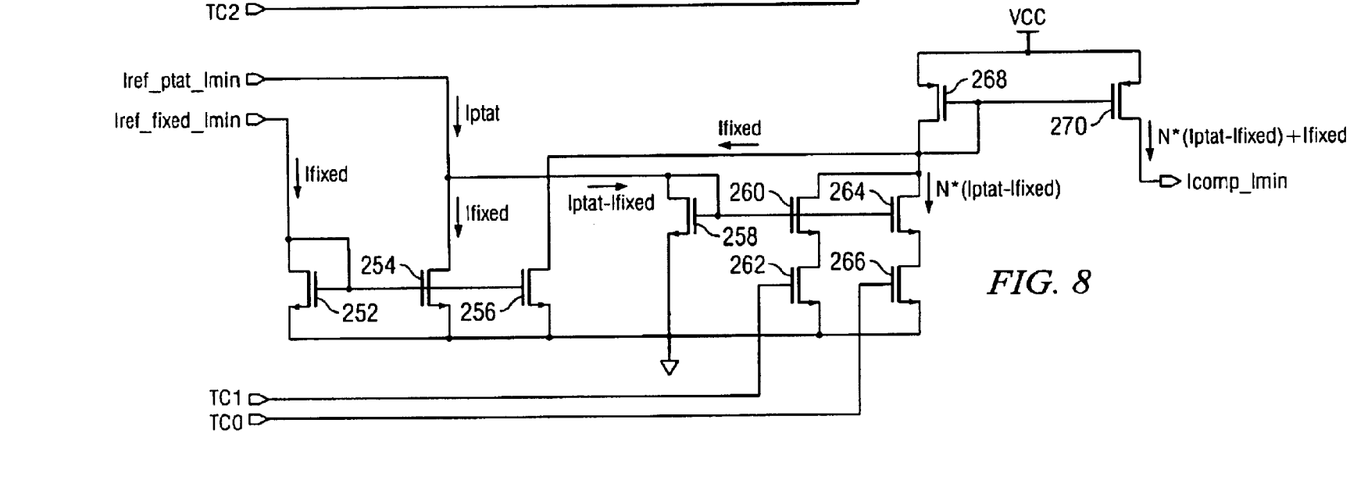

Refer now to FIG. 8, which is an exemplary schematic circuit diagram for providing temperature compensated minimum current to current control 300. This circuit is identical in structure and operation to the circuit of FIG. 7, and is shown for the sake of completeness and to illustrate the independent generation of the minimum and maximum reference currents. The fixed current is received into diode connected device 252, which is also connected to ground potential. Device 252 is connected in a current mirror configuration with devices 254 and 256, such that the fixed current also flows through each of devices 254 and 256. The maximum PTAT current is received at the common node connecting devices 254 and 258. Since the fixed current flows through device 254, the current flowing through device 258 must be the PTAT current minus the fixed current. Devices 260 and 264, connected as shown can conduct the same current as device 258 or a multiple thereof. In the illustrated example, the multiple can be 0, 1, 2, or 3 times, depending on the digital signal, (i.e. 2 bit binary word") received at terminals TC0 and TC1.

The digital signal is provided by the user and is based on the characteristics of the particular load device(s) (e.g. VCSELs). The binary word controlling the minimum current is separate and distinct from the control of the maximum current. Devices 260 and 264 are scaled so that one conducts twice the current of the other. Devices 262 and 266 are utilized as series switches, allowing the currents in devices 260 or 264 to be switched ON or OFF. Thus, in the case where a binary 0 is received, both devices 262 and 266 remain off and no current flows. Rather, fixed current flows from Vcc through device 268 and then device 256 to ground. This fixed current is provided as an output to current control 300 by device 270. The illustrated waveforms of FIG. 5 also apply to the circuit of FIG. 8; however, they are independently obtained as the binary word on terminals TC0 and TC1 is independent of the binary word at terminals TC2 and TC3. Note that inputs TC0, TC1, TC2, and TC3 collectively form the TEMPCOM input to block 200 in FIG. 3.

Figure 9:
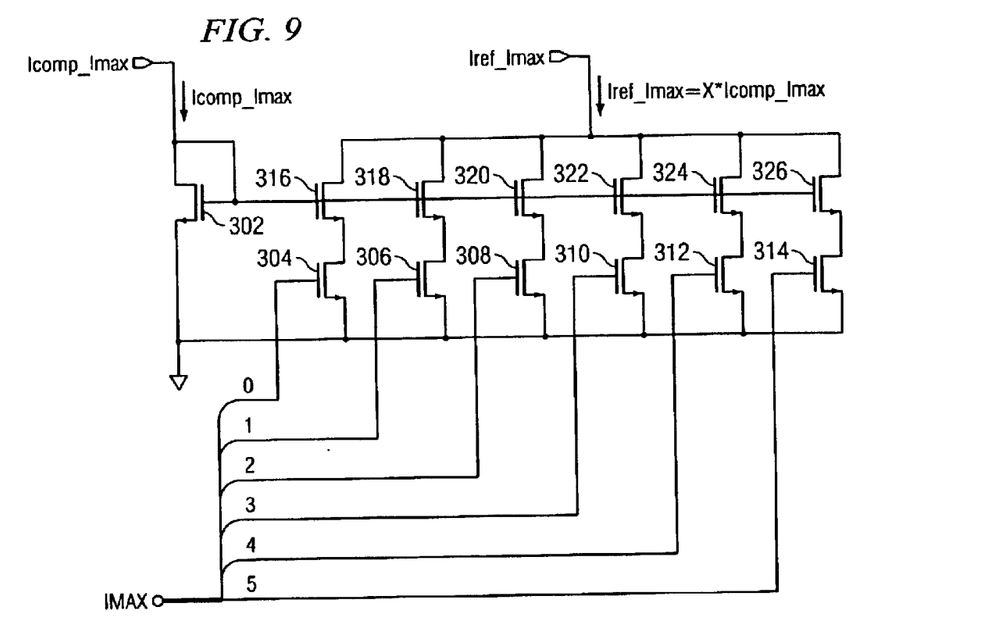
FIGS. 9 and 10 are circuit diagrams illustrating the current control circuit of the present invention.

Refer now to FIG. 9 for an exemplary schematic diagram of a circuit for generating the maximum reference current in current control 300. The temperature compensated maximum current is received at diode connected device 302 from Temperature compensation circuit 200. Devices 316, 318, 320, 322, 324, and 326 are connected in parallel, each in series with its associated switch device 304, 306, 308, 310, 312, and 314, in a current mirror configuration with device 302. In accordance with the invention, devices 316, 318, 320, 322, 324, and 326 are binarily weighted. In practice, the dimensions are scaled, as is well known in power MOSFET technology. Thus, in its ON condition, device 318 conducts twice the current as 316, 320 conducts twice the current as 318, 322 conducts twice the current as 320, 324 conducts twice the current as 322, and 326 conducts twice the current as 324. This implements the six bit binary word received at IMAX such that the most significant bit (e.g. 5) will turn on device 326 resulting in thirty two times as much current as the least significant bit (e.g. 0) turning ON device 316. In this way, the compensated maximum reference current provided to current driver 400 can be varied from zero to 63 times (X times as illustrated in the drawing) the input current received from Temperature compensation circuit 200. This binary word is a programmable digital signal that is provided by the user based on the characteristics of the particular load device, e.g. VCSEL. In this way the varied slope of the Pv.I curves, as shown at various temperatures in FIG. 2 is precisely compensated. The current Imax is supplied to the VCSEL through current driver 400, producing the desired optical power output.

Figure 10:
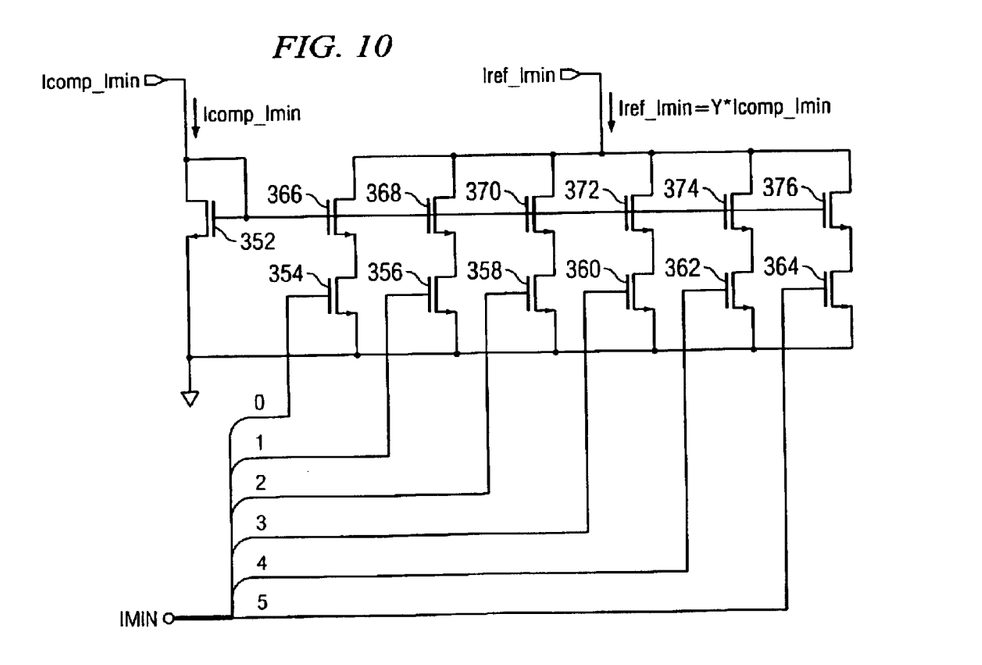

Refer now to FIG. 10 for an exemplary schematic diagram of a circuit for generating the minimum reference current in current control 300. This circuit is identical in structure and operation to the circuit of FIG. 9, and is shown for the sake of completeness and to illustrate the independent generation of the minimum and maximum reference currents. The temperature compensated minimum current is received at diode connected device 352 from Temperature compensation circuit 200. Devices 366, 368, 370, 372, 374, and 376 are connected in parallel, each in series with its associated switch device 354, 356, 358, 360, 362, and 364, in a current mirror configuration with device 352. In accordance with the invention, devices 366, 368, 370, 372, 374, and 376 are binarily weighted. In practice, the dimensions are scaled, as is well known in power MOSFET technology. Thus, in its ON condition, device 368 conducts twice as much current as 366, 370 conducts twice as much current as 368, 372 conducts twice as much current as 370, 374 conducts twice as much current as 372, and 376 conducts twice as much current as 374. This implements the six bit binary word received at IMIN such that the most significant bit (e.g. 5) will turn on device 376 resulting in thirty two times as much current as the least significant bit (e.g. 0) turning ON device 366. In this way, the compensated maximum reference current provided to current driver 400 can be varied from zero to 63 times (Y times as shown in the drawing) the input current received from Temperature compensation circuit 200. This binary word is a programmable digital signal that is provided by the user based on the characteristics of the particular load device, e.g. VCSEL. In this way the varied slope of the Pv.I curves, as shown at various temperatures in FIG. 2 is precisely compensated for Imin. The modulation current is Imax minus Imin.

Figure 11:
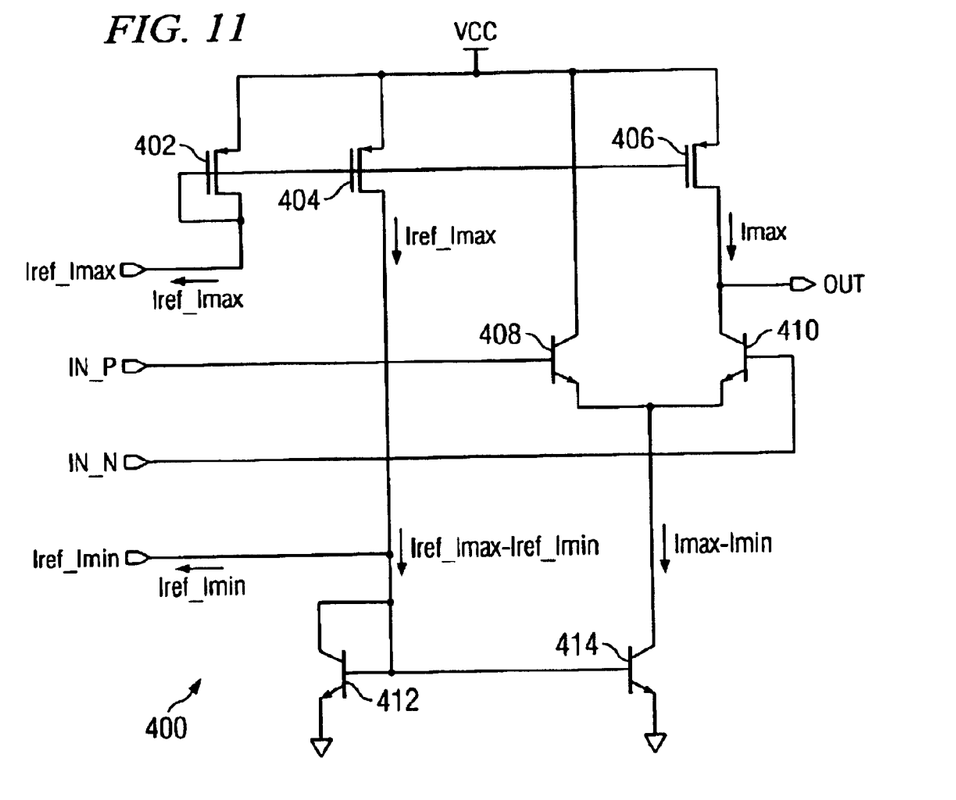
FIG. 11 is a circuit diagram illustrating the current driver of the present invention.

Refer now to FIG. 11, for an exemplary schematic diagram of a circuit for current driver 400; which provides current drive to the load device, e.g. one or more VCSEL diodes. The maximum reference current (Iref_Imax) is received at device 402, which is connected in a current mirror mode with devices 404 and 406. Device 404 is scaled to the same dimension as device 402 so that the maximum reference current also flows through device 404. Device 406 is a larger power transistor and conducts the maximum current (Imax) in a desired ratio to the maximum reference current. It is well known to obtain such a ratio of current by appropriately designing the relative dimensions of transistors 406 and 402. As illustrated, devices 402, 404, and 406 are P channel field effect transistors. Device 408, 410, 412 and 414 are NPN bipolar transistors. Devices 404 and 412 are connected in a series path from Vcc to ground potential. The minimum reference current (Iref_Imin) flows to current control 300 from a common node formed by devices 404 and 412. Since current mirrored transistor 404 conducts the maximum reference current, then device 412 must conduct a current equal to the maximum reference current minus the minimum reference current. This current (maximum reference current minus minimum reference current) is mirrored to device 414 at a desired ratio by designing its dimensions with respect to device 412 (in the same way as with devices 406 and 402).

The high side input signal (IN_P) is received at the base of device 408 and the low side input signal (IN_N) is received at the base of device 410. These input signals represent the high speed digital data desired to be converted into optical form by the VCSEL. The digital signals are complementary and will turn ON one of transistors 408 and 410 while the other one of these transistors is OFF.

In operation, when an "up" level signal is received at the base of 408, transistor 408 conducts while transistor 410 does not conduct. In this way, the maximum current Imax flows through transistor 406 into the VCSEL. In this condition, a current equal to the difference between the maximum and minimum currents is conducted through transistors 408 and 414. Alternatively, when an "up" level signal is received at the base of transistor 410, transistor 410 conducts while transistor 408 does not conduct. The current drawn through transistor 414 is always the difference between the maximum and minimum currents. Thus, the low level current provided to the VCSEL=Imax−(Imax−Imin), which is the minimum drive current (Imin). Accordingly, as the input signal changes from one state to the other, the current provided to the VCSEL changes from Imin to Imax and vice versa, with the DC bias point being half way between Imin and Imax.

The Imax current is generated by device 406 operating in its high-impedance state, often known as saturation. Thus, Imax can approximate the characteristics of an ideal current source, which is a source that can provide a fixed amount of current independent of the voltage across its terminals. The absolute values of Imax and Imin are set independently of each other and are selectively supplied to the VCSEL depending on the input logic level. As opposed to a topology that independently varies the bias and modulation currents, this approach provides precise minimum and maximum currents. This is desired for highly efficient VCSEL operation.

The output current from circuit 400 is also provided as an input to Fault detector circuit 600. Fault detector circuit 600 also receives a reference voltage from Bandgap current reference 100. As previously described, this reference voltage Vref is set by the fixed current passing through resistor 118 in FIG. 6. In case the input impedance of the VCSEL exceeds design parameters (as for example in case of an open circuit), an over-voltage condition will be detected by the Fault detector circuit 600 triggering a fault condition. The output of Fault detector circuit 600 will then disable the drive circuitry. In case the input impedance of the VCSEL falls below design parameters (as for example in case of a short circuit), an under-voltage condition will be detected by Fault detector circuit 600, also triggering a fault condition.

In operation, the method of supplying the precisely controlled current that is substantially insensitive to load impedance variations comprises the steps described above in the circuit operation. In short, fixed currents and PTAT currents are generated in the Bandgap reference circuit 100. The PTAT currents are generated by the use of two temperature sensitive transistors (102 and 104) in Bandgap reference circuit 100. Devices 102 and 104 are placed in physical proximity to the VCSEL, thereby effectively sensing the temperature of the VCSEL. These fixed and PTAT currents are combined in Temperature compensation circuit 200. In particular, the fixed current is subtracted from the PTAT current and the result is multiplied by the temperature compensation factor. The illustrated temperature factor is M for the maximum current and N for the minimum current. In the illustrated example, the temperature compensation factors (M and N) are a two bit binary words separately supplied for the minimum and maximum current. The product thus obtained is then added to the fixed current. Both the minimum and maximum currents are independently combined in the Temperature compensation circuit and supplied to the Current control circuit 300. Next, both such minimum and maximum temperature compensated currents are modified by the binary words IMAX and IMIN to obtain the maximum and minimum reference currents which are then amplified and selectively supplied to the VCSEL by Current driver circuit 400. The amplified maximum and minimum currents are also supplied to Fault detect circuit 600 where they are converted to a voltage that is compared to the reference voltage received by Fault detect circuit 600 from Bandgap current reference 100. If the voltage difference becomes a value outside the limits of the window comparator in Fault detect circuit 600, then the system is disabled.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other configurations of transistors. These alternatives can be suitably selected depending upon the particular application or in consideration of any number of factors associated with the operation of the system. These and other changes or modifications are intended to be included within the scope of the present invention.

What is claimed is:

1. A method of supplying a precisely controlled current, comprising the steps of:
    generating at least one first current that is constant with temperature;
    generating at least one second current that is proportional to temperature;
    combining said first and second currents forming a temperature compensated third current;
    modifying said third current with at least one programmed reference signal to provide at least one precisely controlled reference current; and
    selectively gating said precisely controlled reference current to a load device having a variable slope characteristic.

2. A method as in claim 1 further comprising:
    supplying a voltage resulting from said precisely controlled current to a fault detection device;
    comparing said voltage with a reference voltage; and
    disabling current flow to said control device if the difference between said voltage and said reference voltage exceeds a predetermined value.

3. A method as in claim 1 wherein said at least one first and second current values are approximately equal at 25 degrees centigrade.

4. A method as in claim 1 wherein generating said at least one second current is performed by at least two temperature sensitive transistors having different dimensions.

5. A method as in claim 4 wherein at least one of said two temperature sensitive transistors is placed in physical proximity to a load device, thereby approximating the temperature of the load device.

6. A method as in claim 1, wherein combining said first and second currents comprises:
    subtracting the first current from the second current and multiplying the resulting difference by a factor M; and
    adding the current obtained in the foregoing step to the first current.

7. A method as in claim 6 wherein the factor M is a binary word.

8. A method as in claim 1 wherein in the step of modifying the third current with at least one programmed reference signal, the reference signal is a binary word.

9. A method as in claim 1, wherein the at least one precisely controlled reference current represents the minimum current required to optically generate a binary "0" and further composing the step of providing a fourth current representing the maximum current required to optically generate a binary "1", wherein said third and fourth currents are each independently modified to provide two precisely controlled currents.

10. A method as in claim 9 wherein in selectively gating said precisely controlled current to a load device comprises: selectively gating one of said two precisely controlled currents to said load device.

11. A method as in claim 1 wherein said load device is a vertical cavity surface emitting laser (VCSEL).

12. A current driver circuit for supplying a precisely controlled current, comprising:
    a bandgap reference circuit for generating a fixed current and a current proportional to absolute temperature (PTAT);
    a temperature compensator for combining said fixed and PTAT currents and forming first and second temperature compensated currents;
    a current control circuit for modifying said first and second temperature compensated currents in response to signals representing the characteristics of a load device; and
    a driver circuit for amplifying and supplying a selected one of said first and second temperature compensated currents to said load device.

13. A current driver circuit as in claim 12 wherein said load device comprises: a vertical cavity surface emitting laser (VCSEL).

14. A current driver circuit as in claim 13 wherein said load device comprises: a plurality of vertical cavity surface emitting lasers (VCSEL)s.

15. A current driver circuit as in claim 12, wherein said bandgap reference circuit also generates a reference voltage and further comprising:

fault detection circuit receiving said reference voltage and said selected one of said first and second temperature compensated currents;

said fault detection circuit providing an error signal when said selected one of said first and second temperature compensated current generates a voltage that differs from the reference voltage by more than a predetermined value.

16. A current driver circuit as in claim 12, wherein said bandgap reference circuit comprises:

at least two temperature variant transistors having different dimensions for generating the current proportional to absolute temperature (PTAT).

17. A current driver circuit as in claim 12, wherein said temperature compensator comprises:

first and second transistors having dimensions in a ratio of two to one and providing an output having one of four possible output values determined by the binary state of the input signals received by said first and second transistors.

18. A current driver circuit as in claim 12, wherein said current control circuit comprises:

a plurality of transistors having dimensions in a fixed ratio with respect to each other and providing an output having one of a plurality of precisely controlled output values determined by the binary state of the input signals received by said plurality of transistors.

19. A current driver circuit as in claim 12, wherein said driver circuit comprises:

a first transistor for receiving a high side input signal;

a second transistor for receiving a low side input signal; and a output transistor operating in saturation mode and providing an amplified temperature compensated current to said load device.

20. A current driver circuit as in claim 12, wherein said driver circuit comprises:

a first transistor for receiving a high side input signal;

a second transistor for receiving a low side input signal; and a output transistor operating in saturation mode and providing an amplified temperature compensated current that is a maximum current to said load device when said second transistor is in a non-conducting state.

21. A current driver circuit as in claim 12, wherein said driver circuit comprises:

a first transistor for receiving a high side input signal;

a second transistor for receiving a low side input signal; and an output transistor operating in saturation mode and providing an amplified temperature compensated current having a value that is a maximum current minus a minimum current to said load device when said second transistor is in a conducting state.

22. A method as in claim 1, further comprising the step of: amplifying said precisely controlled current.

* * * * *